（12）United States Patent
Kim et al.

(10) Patent No.: US 10,457,088 B2
(45) Date of Patent: Oct. 29, 2019

(54) TEMPLATE FOR SELF ASSEMBLY AND METHOD OF MAKING A SELF ASSEMBLED PATTERN

(71) Applicants: Jihoon Kim, North Wales, PA (US); Jinxiu Wan, Princeton, NJ (US); Shinji Miyazaki, Bedminster, NJ (US); Guanyang Lin, Whitehouse Station, NJ (US); Hengpeng Wu, Hillsborough, NJ (US)

(72) Inventors: Jihoon Kim, North Wales, PA (US); Jinxiu Wan, Princeton, NJ (US); Shinji Miyazaki, Bedminster, NJ (US); Guanyang Lin, Whitehouse Station, NJ (US); Hengpeng Wu, Hillsborough, NJ (US)

(73) Assignee: Ridgefield Acquisition, Luxembourg (LU)

( * ) Notice: Subject to any disclaimer, the term of this patent is extended or adjusted under 35 U.S.C. 154(b) by 0 days.

(21) Appl. No.: 13/892,890

(22) Filed: May 13, 2013

(65) Prior Publication Data

US 2014/0335324 A1 Nov. 13, 2014

(51) Int. Cl.
*B44C 1/22* (2006.01)
*G03F 7/00* (2006.01)

(52) U.S. Cl.
CPC ............ *B44C 1/227* (2013.01); *G03F 7/0002* (2013.01); *Y10T 428/24802* (2015.01)

(58) Field of Classification Search
CPC ..... Y10T 428/24802; Y10T 428/24355; Y10T 428/24364; B82Y 30/00; B82Y 40/00; B81C 1/0031; H01L 21/0337; H01L 21/0272; H01L 21/0271; H01L 21/3083; H01L 21/3086

See application file for complete search history.

(56) References Cited

U.S. PATENT DOCUMENTS

| | | | |
|---|---|---|---|
| 3,161,630 | A | 12/1964 | Phelisse et al. |
| 3,285,949 | A | 11/1966 | Siebert |
| 3,474,054 | A | 10/1969 | White |
| 3,919,077 | A | 11/1975 | Whitehurst |
| 4,200,729 | A | 4/1980 | Calbo |
| 4,251,665 | A | 2/1981 | Calbo |
| 4,698,394 | A | 10/1987 | Wong |
| 5,136,029 | A | 8/1992 | Furukawa et al. |
| 5,187,019 | A | 2/1993 | Calbo et al. |
| 5,446,125 | A | 8/1995 | Honda et al. |

(Continued)

FOREIGN PATENT DOCUMENTS

| | | |
|---|---|---|
| CA | 1 293 090 C | 12/1991 |
| EP | 0 227 124 A2 | 7/1987 |

(Continued)

OTHER PUBLICATIONS

T. Thurn-Albrecht et al., "Ultrahigh-Density Nanowire Arrays Grown in Self-Assembled. Diblock Copolymer Templates", Science Vo. 290, pp. 2126-pp. 2129 (2000).

(Continued)

*Primary Examiner* — Nancy R Johnson
(74) *Attorney, Agent, or Firm* — Francis M. Houlihan

(57) ABSTRACT

Disclosed and claimed herein is a template for directing a pattern in a block copolymer film and the process of making the pattern.

9 Claims, 3 Drawing Sheets

(56) References Cited

U.S. PATENT DOCUMENTS

| | | | |
|---|---|---|---|
| 5,674,662 A | 10/1997 | Szmanda et al. | |
| 5,929,204 A | 7/1999 | Noguchi et al. | |
| 6,512,020 B1 | 1/2003 | Asakura et al. | |
| 7,471,614 B2 | 12/2008 | Frommer et al. | |
| 7,521,094 B1 | 4/2009 | Cheng et al. | |
| 7,560,141 B1 | 7/2009 | Kim et al. | |
| 7,846,502 B2 | 12/2010 | Kim et al. | |
| 7,964,107 B2 | 6/2011 | Millward | |
| 8,017,194 B2 | 9/2011 | Colburn | |
| 8,226,838 B2 | 7/2012 | Cheng et al. | |
| 8,309,278 B2 | 11/2012 | Yang et al. | |
| 8,426,313 B2 | 4/2013 | Millward et al. | |
| 8,491,965 B2 | 7/2013 | Chong et al. | |
| 8,686,109 B2 | 4/2014 | Yin et al. | |
| 8,691,925 B2 | 4/2014 | Wu et al. | |
| 8,795,539 B2 | 8/2014 | Lee et al. | |
| 8,835,581 B2 | 9/2014 | Wu et al. | |
| 9,040,659 B2 | 5/2015 | Yin et al. | |
| 9,052,598 B2 | 6/2015 | Wu et al. | |
| 9,181,449 B2 | 11/2015 | Yi et al. | |
| 2004/0151690 A1 | 8/2004 | Nakanishl et al. | |
| 2004/0157948 A1 | 8/2004 | Schlueter | |
| 2005/0062801 A1 | 3/2005 | Kato et al. | |
| 2007/0276104 A1 | 11/2007 | Harruna et al. | |
| 2008/0286659 A1* | 11/2008 | Millward | B81C 1/00031 430/5 |
| 2008/0299353 A1 | 12/2008 | Stoykovich et al. | |
| 2008/0318005 A1 | 12/2008 | Millward | |
| 2009/0035668 A1 | 2/2009 | Breyta et al. | |
| 2009/0075002 A1 | 3/2009 | Kim et al. | |
| 2009/0087653 A1 | 4/2009 | Nealey et al. | |
| 2009/0179002 A1 | 7/2009 | Cheng et al. | |
| 2009/0196488 A1 | 8/2009 | Nealey et al. | |
| 2010/0124629 A1 | 5/2010 | Gopalan et al. | |
| 2010/0316849 A1 | 12/2010 | Millward et al. | |
| 2011/0147984 A1 | 6/2011 | Cheng et al. | |
| 2012/0273460 A1 | 11/2012 | Kang et al. | |
| 2012/0285929 A1 | 11/2012 | Matsumura et al. | |
| 2013/0012618 A1 | 1/2013 | Hiro et al. | |
| 2013/0280497 A1 | 10/2013 | Wilson et al. | |
| 2013/0330668 A1 | 12/2013 | Wu et al. | |
| 2014/0116980 A1* | 5/2014 | Wuister | G03F 7/0002 216/11 |
| 2014/0151330 A1 | 6/2014 | Yin et al. | |
| 2014/0193754 A1 | 7/2014 | Wu et al. | |
| 2015/0093912 A1 | 4/2015 | Wu et al. | |
| 2015/0166821 A1 | 6/2015 | Yi et al. | |

FOREIGN PATENT DOCUMENTS

| | | |
|---|---|---|
| EP | 1 095 711 A2 | 5/2001 |
| GB | 715913 | 9/1954 |
| JP | 58-225103 A | 12/1983 |
| JP | 2003-48929 A | 2/2003 |
| JP | 2003-238682 A | 8/2003 |
| JP | 2008-88368 A | 4/2008 |
| JP | 2008-158007 A | 7/2008 |
| JP | 2010-522643 A | 7/2010 |
| JP | 2010-260883 A | 11/2010 |
| JP | 2011-18778 A | 1/2011 |
| JP | 2011-515537 A | 5/2011 |
| WO | WO 2008/097736 A2 | 8/2008 |
| WO | WO 2012/022390 A1 | 2/2012 |
| WO | WO 2012/161106 A1 | 11/2012 |
| WO | WO 2013/050338 A1 | 4/2013 |
| WO | WO 2013/156240 A1 | 10/2013 |
| WO | WO 2013/160027 A1 | 10/2013 |

OTHER PUBLICATIONS

Toru Yamaguchi et al., "Resist-Pattern Guided Self-Assembly of Symmetric Diblock Copolymer", Journal of Photopolymer Science and Technology vol. 19 No. 3, pp. 385-pp. 388 (2006).
Toru Yamaguchi et al., "Two-Dimentional Patterning of Flexible Designs with High Half-Pitch Resolution by Using Block Copolymer Lithography", Advanced Materials vol. 20, pp. 1684-pp. 1689 (2008).
Yuanlie Yu et al., "The synthesis of novel fluorine-containing random polymer and application in modification of solid surfaces", Surface & Coatings Technology vol. 205, pp. 205-pp. 212 (2010).
Notice of Allowance and Fee(s) Due dated Apr. 21, 2014 for U.S. Appl. No. 13/492,125.
Form PCT/ISA/220, Form PCT/ISA/210, and Form PCT/ISA/237 dated Feb. 26, 2013 for PCT/IB2012/001905, which corresponds to U.S. Appl. No. 13/243,640.
Form PCT/IB/326, Form PCT/IB/373, and Form PCT/ISA/237 dated Apr. 3, 2014 for PCT/IB2012/001905, which corresponds to U.S. Appl. No. 13/243,640.
Notice of Allowance and Fee(s) Due notification dated Feb. 20, 2015 for U.S. Appl. No. 14/180,848.
Machine Language English Abstract from JPO of JP 58-225103 A.
Machine Language English Abstract and Translation from JPO of JP 2013-8951 A, which is equivalent to WO 2012/161106 A1.
Form PCT/ISA/220) Form PCT/ISA/210, and Form PCT/ISA/237 dated Feb. 26, 2013 for PCT/IB2012/001905, which corresponds to U.S. Appl. No. 13/164,869.
Form PCT/ISA/220) Form PCT/ISA/210, and Form PCT/ISA/237 dated Jul. 11, 2013 for PCT/EP2013/053548, which corresponds to U.S. Appl. No. 13/416,669.
Form PCT/ISA/220) Form PCT/ISA/210, and Form PCT/ISA/237 dated Aug. 28, 2013 for PCT/EP2013/001423, which corresponds to U.S. Appl. No. 13/492,125.
Koji-Asakawa et al., "Nanopatterning with Microdomains of Block Copolymers using Reactive-Ion Etching Selectivity", Jpn. J. Appl. Phys. vol. 41 Part 1 No. 10, pp. 6112-pp. 6118 (2002).
Joona Bang et al., "Facile Routes to Pafterned Surface Neutralization Layers for Block Copolymer Lithography", Advanced Materials vol. 19, pp. 4552-pp. 4557 (2007).
Christopher N. Bates et al., "Single- and Dual-Component Gross-Linked Polymeric Surface Treatments for Controlling Block Copolymer Orientation", Polymer Preprints vol. 52(1), pp. 181-pp. 182 (2011).
C.T. Black et al., "Integration of self-assembled diblock copolymers for semiconductor capacitor fabrication," Applied Physics Letters vol. 79 No. 3, pp. 409-pp. 411 (2001).
Kenneth C. Caster, "Applications of Polymer Brushes and Other Surface-Attached Polymers", Polymer Brushes Part 17, pp. 331-370 (2004).
Ghislain David et al., "Synthesis of α,ω-Phosponate Polysterene via Dead End Polymerization, Phosporus, Sulfur, and Silicon", Phosphorus, Sulfur, and Silicon vol. 179 No. 12, pp. 2627-pp. 2634 (2004).
Eric Drockenmuller et al., "Covalent Stabilization of Nanostructures: Robust Block Copolymer Templates from Novel Thermoreactive Systems," Journal of Polymer Science: Part A: Polymer Chemistry, vol. 43, pp. 1028-pp. 1037 (2005).
Iain E. Dunlop, "Interactions Between Polymer Brushes: Varying the Number of End-Attaching Groups", Macromol. Chem. Phys. vol. 205, pp. 2443-pp. 2450 (2004).
Eungnak Han et al., "Photopatternable Imaging Layers for Controlling Block Copolymer Microdomain Orientation", Advanced Materials vol. 19, pp. 4448-pp. 4452 (2007).
Craig J. Hawker et al., "Facile Synthesis of Block Copolymers for Nanolithographic Applications", Polymer Preprints vol. 46(2), pp. 239-pp. 240 (2005).
Craig J. Hawker, "Initiating Systems for Nitroxide-Mediated Living" Free Radical Polymerizations: Synthesis and Evaluation, Macromolecules vol. 29 No. 16, pp. 5245-pp. 5254 (1996).
Atsushi Hieno et al., "Quick Formation of DSA Neutralization Polymer Layer Attached by Reactive Self-Assembled Monolayer," J. Photopol. Sci. Tech. vol. 25 No. 1, pp. 73-pp. 76 (2012).
E. Huang et al., "Using Surface Active Random Copolymers to Control the Domain Orientation in Diblock Copolymer Thin Films", Macromolecules vol. 31 No. 22, pp. 7641-pp. 7650 (1998).

(56) References Cited

OTHER PUBLICATIONS

Shengxiang Ji et al., "Preparation of Neutral Wetting Brushes for Block Copolymer Films from Homopolymer Blends", Advanced Materials vol. 20, pp. 3054-pp. 3060 (2008).
G. J. Kellogg et al., "Observed Surface Energy Effects in Confined Diblock Copolymers", Physical Review Letters vol. 76 No. 14, pp. 2503-pp. 2506 (1996).
Bokyung Kim et al., "Dewetting of PMMA on PS-Brush Substrates", Macromolecules vol. 42 No. 20, pp. 7919-pp. 7923 (2009).
Bong Hoon Kim et al.; The Synthesis of Randum Brush for Nanostructure of Block Copolymer, Macromol. Symp., vol. 249-250, pp. 303-pp. 306 (2007).
Bumjoon J. Kim et al., "Importance of End-Group Structure in Controlling the Interfacial Activity of Polymer-Coated Nanoparticles", Macromolecules vol. 40 No. 6, pp. 1796-pp. 1798 (2007).
Yoojin Kim et al., "Effect of Architecture on the Self-Assembly of Block Copolymers at Interfaces: Linear-nanoparticle vs. Linear AB Diblocks", Polymeric Materials: Science & Engineering Vo. 92, pp. 399-pp. 400 (2005).
Yoojin Kim et al., "The Dramatic Effect of Architecture on the Self-Assembly of Block Copolymers at Interfaces", Langmuir vol. 21 No. 23, pp. 10444-pp. 10458 (2005).
Massimo Lazzari et al., "Methods for the Alignment and the Large-scale Ordering of Block Copolymer Morphologies," Block Copolymers in Nanoscience, Edited by M. Lazzari, G. Liu, and S. Lecommandoux, Copyright © 2006 Wiley-VCH Verlag GmbH & Co. KGaA, Weinheim, pp. 191-pp. 231.
Julie M. Leiston-Belanger et al., "A Thermal and Manufacture Approach to Stabilized Diblock Copolymer Templates", Macromolecules vol. 38 No. 18, pp. 7676-pp. 7683 (2005).
Mao-Peng Lin et al., "Photocrosslinking of Polymers Containing Cationically Polymerizable Groups in the Side-Chain by Sulfonium Salts," Journal of Polymer Science Part A: Polymer Chemistry vol. 30 Issue 5, pp. 933-pp. 936, (1992).
Nancy A. Listigovers et al., "Narrow Polydispersity Diblock and Triblock Copolymers of Alkyl Acrylates by a "Living" Stable Free Radical Polymerization", Macromolecules vol. 29 No. 27, pp. 8992-pp. 8993 (1996).
Hul Liu et al., "Random Poly(methyl methacrylate-co-styrene) Brushes by ATRP to Create Neutral Surfaces for Block Copolymer Self-Assembly," Macromol. Chem. Phys. vol. 213, pp. 108-pp. 115 (2012).
P. Mansky et al., "Controlling Polymer-Surface Interactions with Random Copolymer Brushes", Science Magazine vol. 275, pp. 1458-pp. 1460 (1997).
Holger Merlitz, "Surface Instabilities of Monodisperse and Densely Grafter Polymer Brushes", Macromolecules vol. 41 No. 13, pp. 5070-pp. 5072 (2008).
Hironobu Murata et al., "Synthesis of Functionalized Polymer Monolayers from Active Ester Brushes", Macromolecules vol. 40 No. 15, pp. 5497-5503 (2007).
Timothy E. Patten et al., "Atom Transfer Radical Polymerization and the Synthesis of Polymeric Materials", Adv. Mater. vol. 10 issue 12, pp. 901-pp. 915 (1998).
R. P. Quirk et al., "Thermoplastic Elastomers 2nd Edition", Hanser/Gardner Publications, pp. 74-pp. 78 (1996).
Ricardo Ruiz et al., "Density Multiplication and Improved Lithography by Directed Block Copolymer Assembly", Science Magazine vol. 321, pp. 936-pp. 939 (2008).

Du Yeol Ryu et al., "Cylindrical Microdomain Orientation of PS-b-PMMA on the Balanced Interfacial Interactions: Composition Effect of Block Copolymers," Macromolecules vol. 42 No. 13, pp. 4902-pp. 4906 (2009).
Du Yeol Ryu et al., "A Generalized Approach to the Modification of Solid Surfaces", Science Magazine vol. 308, pp. 236-pp. 239 (2005).
I. E. Serhatli, "Synthesis of hybrid liquid crystalline block copolymers by combination of cationic or promoted cationic and free-radical polymerizations", Polymer Bulletin vol. 34, pp. 539-pp. 546 (1995).
Kazuo Sugiyama et al., "Preparation of surface-modified polysterene microspheres by an azo-initiator having analogous structure to the head group of phosphatidylcholine", Macromol. Chem. Phys. vol. 195, pp. 1341-pp. 1352 (1994).
Notice of Allowance and Fee(s) Due dated May 19, 2014 for U.S. Appl. No. 13/492,125.
Office Action dated Oct. 10, 2014 for U.S. Appl. No. 14/175,203.
Restriction Requirement dated Dec. 26, 2014 for U.S. Appl. No. 14/039,809.
Form PCT/ISA/220, Form PCT/ISA/210, and Form PCT/ISA/237 dated Feb. 10, 2015 for PCT/EP2014/076849, which corresponds to U.S. Appl. No. 14/039,890.
Nathan D. Jarnagin et al., PS-b-PHOST as a High x Block Copolymers for Directed Self Assembly: Optimnization of Underlayer and Solvent Anneal Processes, SPIE vol. 8680, pp. 86801X-1-pp. 86801X-10 (2013).
Form PCT/ISA/220, Form PCT/ISA/210, Form PCT/ISA/237 dated Aug. 6, 2014 for PCT/EP2014/059568, which corresponds to U.S. Appl. No. 13/892,890.
Joy Y. Cheng et al., "Templated Self-Assembly of Block Copolymers: Effect of Substrate Topography**", Adv. Mater. vol. 15 No. 19, pp. 1599-pp. 1602 (2003).
Form PCT/ISA/220, Form PCT/ISA/210, and Form PCT/ISA/237 dated Jan. 14, 2015 for PCT/EP2014/070391, which corresponds to U.S. Appl. No. 14/039,809.
Notice of Allowance and Fee(s) Due dated Jan. 22, 2015 for U.S. Appl. No. 14/175,203.
Form PCT/ISA/220, Form PCT/ISA/210, and Form PCT/ISA/237 dated Jan. 14, 2015 for PCT/EP2014/070391, which corresponds to U.S. Appl. No. 14/039,890.
Notice of Allowance and Fee(s) Due dated Mar. 27, 2015 for U.S. Appl. No. 14/039,809.
Office Action dated Apr. 16, 2015 for U.S. Appl. No. 14/107,325.
Communication pursuant to Rules 161(1) and 162 EPC dated Jan. 13, 2016 for EP 14724698.7, which corresponds to U.S. Appl. No. 13/892,890.
Notice of Allowance and Fee(s) Due dated Aug. 19, 2015 for U.S. Appl. No. 14/107,325.
Notification Concerning Transmittal of International Preliminary Report on Patentability (Chapter I of the Patent Cooperation Treaty) (Form PCT/IB/326), International Preliminary Report on Patentability (Chapter I of the Patent Cooperation Treaty) (Form PCT/IB/373), and Written Opinion of the International Searching Authority (Form PCT/ISA/237) dated Jun. 30, 2016 for PCT/EP2014/076849, which corresponds to to U.S. Appl. No. 14/107,325.
Communication pursuant to Rules 161(10 and 162 EPC dated May 6, 2016 for EP 14772161.3, which corresponds to U.S. Appl. No. 14/039,890.
Machine Language English Bibliographic Data and translation of JP2008-158007A, Jul. 10, 2008, JSR Corp.

* cited by examiner (a) (b)

TEMPLATE FOR SELF ASSEMBLY AND METHOD OF MAKING A SELF ASSEMBLED PATTERN

FIELD OF THE INVENTION

The present application for patent is in the field of directed self assembly using block copolymers and more specifically is in the field of directed self assembly and pattern multiplication using a novel template.

BACKGROUND

Directed self assembly (DSA) of block copolymers is a method useful for generating patterned features for the manufacture of microelectronic devices, wherein the features have critical dimensions (CD) on the order of 2-50 nm (nanometers). Templated DSA methods have been used to extend the resolution capabilities beyond what may be obtained with conventional lithography. In a conventional lithography approach, ultraviolet (UV) or other radiation may be used to expose an image, using a transmission or reflecting mask, onto a photoresist layer coated on a substrate. This approach is limited by such factors as the physics of diffraction and shot noise. On the other hand, DSA techniques, such as graphoepitaxy and chemoepitaxy, may enhance resolution while reducing CD variation, when used in conjunction with conventional lithography.

Block copolymers used in DSA may comprise a removable polymer block having a given repeat unit and one or more additional blocks that may remain after the first block is removed, each, respectively, having another repeat unit. In any case, the block copolymer is coated, on a substrate, and allowed to phase separate or align during annealing. The annealed polymer exhibits an inherent pitch or repeat distance, while the individual separated blocks each exhibit an inherent width, usually determined by their respective molar masses. While it is possible to ascertain the inherent pitch of the block copolymer and inherent widths of the individual blocks after an undirected annealing step, a more accurate and precise measurement is usually accomplished after directed self assembly.

As noted supra, DSA may be accomplished by graphoepitaxy or chemoepitaxy, inter alfa. In graphoepitaxy, a block copolymer self organizes according to a substrate that may be patterned with conventional lithography (UV, Deep UV, e-beam, EUV, or ion beam, for example) to form repeating topographical features such as lines and spaces (LS), extended or segmented trenches, extended or segmented rails, contact holes (CH) or other patterns useful in semiconductor manufacture. In one example of a LS directed self assembly array, a selected block copolymer, having approximately an integer number of inherent pitch distances of the block copolymer relative to the pitch distance between printed lithographic rails can form a self-aligned pattern between the rails that is an integeral multiple of the rail-to-rail distance. Such an integral relationship may be termed commensurate or multiply commensurate. In addition, posts and linear and shaped segmented rails may be used to direct the self assembly of a block copolymer into more complex lithographic patterns. For example, Yang et al. in U.S. Pat. No. 8,309,278 disclose a template for this purpose comprising a two-dimensional array of first posts, wherein the first posts are spaced apart from each other in a first direction by a first spacing $L_x$ and in a second direction by a second spacing Ly, and a second post disposed near one of the first posts, wherein the second post is spaced apart from the one of the first posts by a third spacing, wherein the third spacing is different than the first spacing $L_x$ and the second spacing $L_y$; and a polymer pattern self-assembled on the template, wherein the first spacing $L_x$ and/or the second spacing $L_y$ is commensurate with an equilibrium periodicity La, commonly also known as Lo, of a block copolymer of the polymer pattern, and wherein the second post is disposed at a position of a bend in the polymer pattern.

In chemoepitaxy, a block copolymer self organizes according to a substrate that may be patterned (using UV, Deep UV, e-beam, EUV, or ion beam lithography, for example) to form repeating patterns of differing chemical affinity. These have little or no topographical patterning but can align the separated phases of the block copolymer by "pinning" one of the blocks to the region on the substrate to which that block has affinity. In one example of a line space directed self assembly array, a selected block copolymer, having approximately an integer number of inherent pitch distances relative to the distance between patterned affinity areas, can form a self-aligned pattern between those areas that is an integral multiple of the rail-to-rail distance. Such a condition may be termed commensurate or multiply commensurate. Affinity regions may comprise a neutral region, having similar affinity for either of the blocks, punctuated by regions having an affinity for one of the polymer blocks. The affinity may be introduced to the surface using plasma etch processes, exposure to light or other radiation such as electron beams or ion beams, patterning with a standard lithographic material such as a photoresist, and depositing a thin layer on the surface using chemical vapor deposition, evaporation, sputtering or other deposition process or image-wise treating with a coupling agent such as a silylation agent. For example, in U.S. Pat. No. 8,226,838, Cheng et al. disclose a method of forming polymer structures comprising: applying a solution of a diblock copolymer assembly comprising at least one diblock copolymer that forms lamellae, to a neutral surface of a substrate having a chemical pattern thereon, the chemical pattern comprising alternating pinning and neutral regions that are chemically distinct and have a first spatial frequency given by the number of paired sets of pinning and neutral regions along a given direction on the substrate; and forming domains comprising blocks of the diblock copolymer, wherein the domains formed by lateral segregation of the blocks, wherein at least one domain has an affinity for the pinning regions and forms on the pinning region, and wherein the domains so formed are aligned with the underlying chemical pattern, wherein domains that do not form on the pinning region form adjacent to and are aligned with the domains formed on the pinning regions, such that a structure comprising repeating sets of domains is formed on the chemical pattern with a second spatial frequency given by the number of repeating sets of domains in the given direction, the second spatial frequency being at least twice that of the first spatial frequency.

Neutral layers are layers deposited on a substrate or the surface of a treated substrate which have little or no preferential affinity for either of the block segments of a block copolymer employed in directed self assembly. In graphoepitaxy, neutral layers within or surrounding lithographic features may allow the proper placement or orientation of block polymer segments which leads to the desired pattern. In chemoepitaxy, modification of selected areas of the neutral layer occurs so that they have affinity for one of the blocks of the block copolymer; thus pinning that block to the modified portion and resulting in the desired pattern and allowing the copolymer blocks to self-assemble on the neutral portion.

Both graphoepitaxy and chemoepitaxy have been demonstrated. However, each of these two methods has limited use in generating patterns with high resolution and low CD variation, for different reasons. For example, in graphoepitaxy, the placement accuracy and edge roughness of the block-copolymer domains deteriorates during pattern formation due to variation in thickness uniformity of the over-coating of polymer film and due to imperfections in the topographical pre-patterns. The graphoepitaxy process also typically results in formation of a half-width domain next to each of the sidewalls so that the pattern spacing across the subdivided channel is not uniform. While chemical epitaxy may allow a gain in CD control because of its lower topography, the options for image wise chemical modification of surfaces are limited, which may result in inadequate pinning of one of the blocks of the block copolymer.

Thus, due to the aforesaid limitations, there remains a need for a directed self assembly method that employs a template that is capable of providing strong image-wise pinning of one or more blocks of the block copolymer.

DETAILED DESCRIPTION OF THE DRAWINGS

Figure 1:
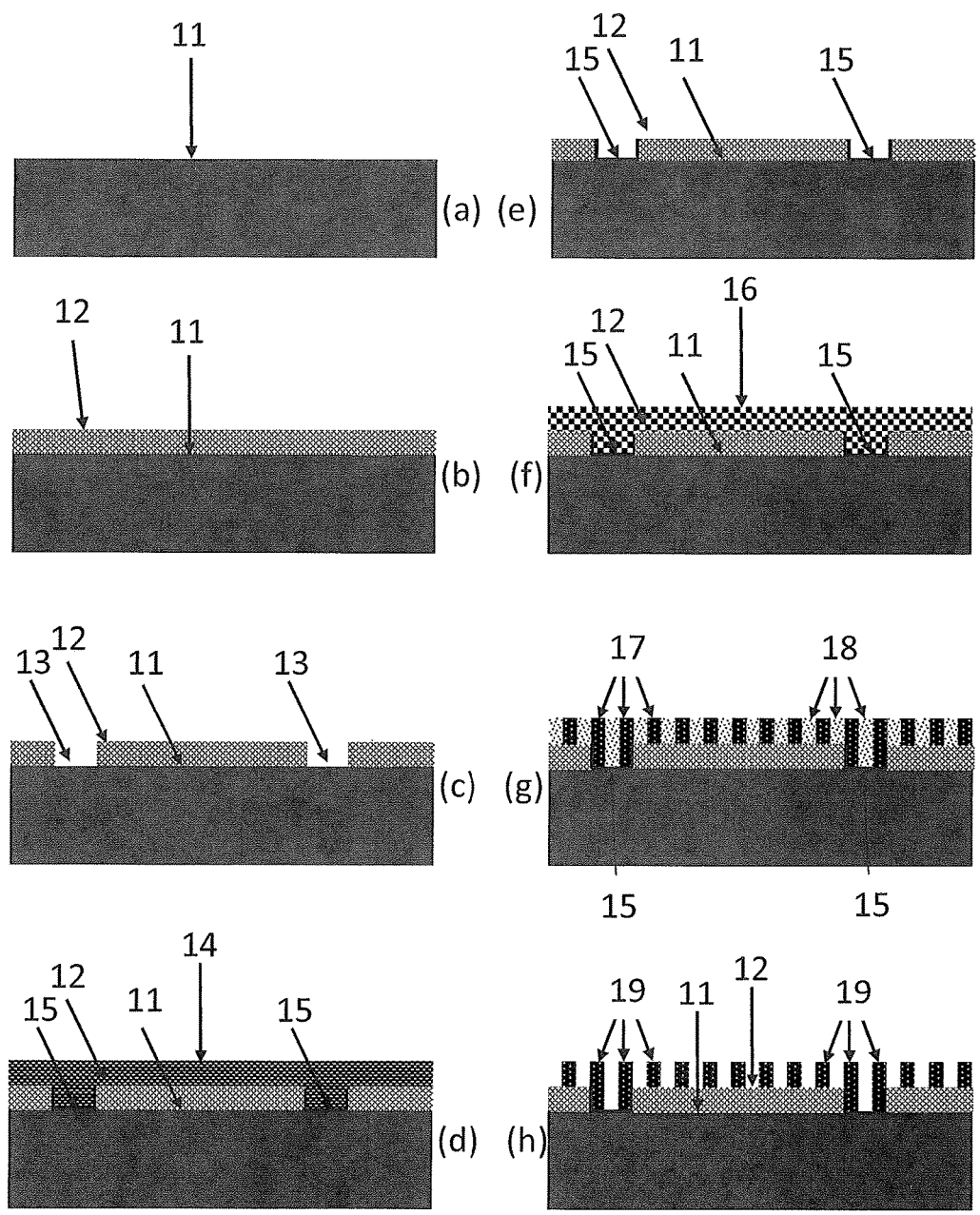
FIG. 1 illustrates, in cross section, the overall scheme of the directed self assembly process and template structures disclosed herein.

FIG. 1 illustrates, in cross section, the overall scheme of the directed self assembly process and template structures disclosed herein. In particular, FIG. 1(a) represents a base, 11. FIG. 1(b) represents a base, 11, coated with a neutral layer, 12. FIG. 1(c) represents a base, 11, coated with a neutral layer, 12, wherein the neutral layer has been patterned selectively to provide trenches, 13. FIG. 1(d) shows the structure of FIG. 1(c), coated with a pinning material, 14, wherein the pinning material has a greater affinity for one of the two or more spontaneously separating blocks than for any other of the two or more spontaneously separating blocks of a selected block copolymer. Shown are the base, 11, the patterned neutral layer, 12, the interface created by the adhered pinning material, 15. FIG. 1(e) represents the base, 11, and the patterned neutral layer, 12, wherein the trench surfaces are coated by the adhering pinning layer, 15. The remaining pinning material has been removed from the top surface of the neutral layer, as well as from the trenches leaving the pinning material on the trench surfaces and the neutral layer substantially exposed. FIG. 1(f) shows the structure of FIG. 1(e) coated with a selected diblock copolymer, 16, wherein the blocks are thermodynamically incompatible and tend to separate spontaneously from each other. FIG. 1g) represents the structure of FIG. 1(e) coated with a diblock copolymer that has been allowed to anneal and separate into its respective blocks, 17 and 18; wherein the block, 17, has affinity to the pinning material on the surface of the trench, (may be obscured in the drawing). The block, 18, has less affinity to the pinning material, 15, and is, therefore, not pinned to that region. The blocks 17 and 18 also self organize over the neutral layer, 12, once the block, 17 is pinned by 15. The modified trench surfaces, 15, are spaced such that the distance between them is multiply (9×) commensurate with the characteristic pitch of the block copolymer. FIG. 1(h) represents the structure of FIG. 1(g) with the blocks 18 removed by wet etching, plasma etching or reactive ion etching, leaving the blocks, 19. The pattern density is thereby multiplied by a factor of 9, relative to the original pattern density represented by the trenches, 13.

Figure 2:
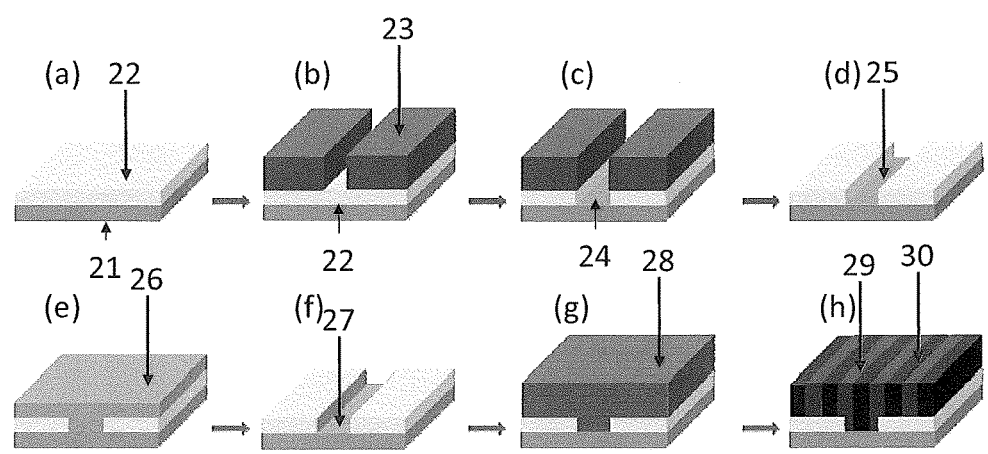
FIG. 2 illustrates, in oblique projection, how pattern multiplication may be obtained from the pinning of self assembled features according to the process and template structures disclosed herein.

FIG. 2 illustrates, in oblique projection, how pattern multiplication may be obtained from the pinning of self assembled features according to the process and template structures disclosed herein. FIG. 2(a) represents the base, 21, coated by a neutral layer, 22. FIG. 2(b) represents a patterned photoresist, 23, on the neutral layer 22. FIG. 2(c) represents the etched neutral layer, 24, masked by the patterned photoresist, 23. FIG. 2(d) represents the trench, 25 in the neutral layer and over the substrate surface after the photoresist has been removed. In one embodiment, the etching process has modified the surface of the neutral layer and the substrate surface to accommodate adhesion of the pinning material. FIG. 2(e) represents the neutral layer and the trench coated with the pinning material, 26. FIG. 2(f) represents the neutral layer with most of the pinning material removed except for the pinning material remaining as a coating on the trench surface, 27. FIG. 2(g) represents the structure of FIG. 2(f), coated with a selected block copolymer, 28. FIG. 2(h) represents the structure of FIG. 2(g), but with the block copolymer annealed into its respective domain blocks, 29, and 30. The pinning layer in the trench is seen as having directed the phase separation such that the phase, 29, is pinned to the sides and bottom of the modified trench, surface and separated from the phases, 30.

Figure 3:
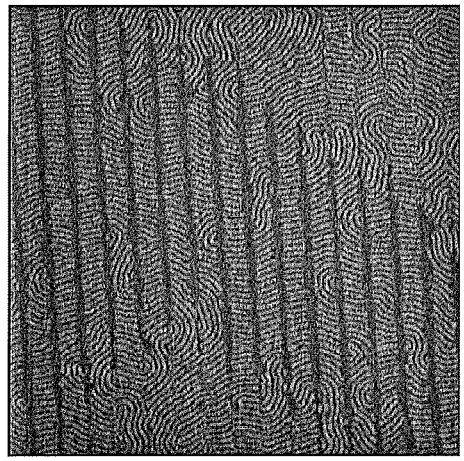
FIG. 3 presents comparative data, illustrating the result of annealing of a block copolymer coated over trenches without and with the pinning material.
Figure 3:
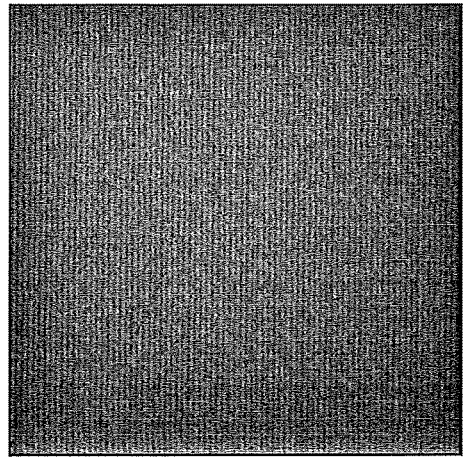

FIG. 3 presents comparative data, illustrating the result of annealing of a block copolymer coated over trenches without and with the pinning material. FIG. 3(a) shows the results of a block copolymer coated over trenches but without treatment by the pinning material as in FIG. 2(e). As can be seen, the pattern, thus produced, is not aligned to the trenches. FIG. 3(b) shows a directed self assembly pattern made using the templates represented in FIG. 1(e) or FIG. 2(d), wherein the trenches are pitched at about 4× the characteristic domain pitch of the block copolymer, the natural periodicity Lo. Further experimental details are reported infra.

DETAILED DESCRIPTION

As used herein, the conjunction "and" is intended to be inclusive and the conjunction "or" is not intended to be exclusive unless otherwise indicated or required by the context. For example, the phrase "or, alternatively" is intended to be an exclusive or.

As used herein, the pitch on a given substrate is represented by a distance between a point on a given feature and an equivalent point on a neighboring feature. For repeating features, for example, the pitch is simply the repeat distance.

As used herein, "phase-separate" refers to the propensity of incompatible blocks of block copolymers to form discrete nano-phase-separated domains, also referred to as "nanodomains" and also simply as "domains". The blocks of the same monomer aggregate to form periodic domains, and the spacing and morphology of domains depends on the interaction and volume fraction among different blocks in the block copolymer. Domains of block copolymers can form during applying, such as during a spin-casting step, during a heating step in which the block copolymer is annealed, or can be accomplished by another annealing step.

As used herein, the characteristic pitch of a block copolymer is the distance determined after annealing between a point on one of the blocks and an equivalent point on a neighboring similar block. For example, in a diblock copolymer, A-B in which the blocks are separated into parallel lines, the characteristic pitch might be the perpendicular distance between the leading edge of a given B block and the leading edge of a neighboring B block.

As used herein, the term "surface affinity" or, simply "affinity" is understood to refer to the surface interaction energy between two substances. Surface affinities may be considered in absolute terms or relative to some other state. By convention, lower energy interactions such as negative energy values are characteristic of higher affinity and higher energy interactions are characteristic of lower affinity. A neutral affinity surface is one that exhibits a relatively small difference in surface interaction energy for one material or block (in a block copolymer) relative to another. One measure of surface affinity is the degree to which one material can "wet" another. For example, if a surface has substantially the same surface affinity to both block components A and B of a block copolymer, such a surface is considered a neutral affinity surface or a non-preferential surface, i.e., both block components A and B can wet or have affinities to such a surface. In contrast, if a surface has significantly different surface affinities for the block components A and B, such a surface is then considered a preferential or high affinity surface, i.e., one of block components A and B can wet such a surface, significantly more than the other.

Disclosed herein is a template for directing a pattern in a block copolymer film, said block copolymer having two or more spontaneously separating blocks, said template comprising: a substrate comprising a base and a neutral coating on the base, said neutral coating having an array comprising two or more trenches etched therein; said trenches having walls and floors; and a pinning material in the trenches, said pinning material having a greater affinity for one of the two or more spontaneously separating blocks than for any other of the two or more spontaneously separating blocks; wherein each block in the block copolymer has a characteristic length, wherein the block copolymer has a characteristic pitch, wherein the pinning material is coated on the walls and floors of the trenches, and wherein the trenches are dimensioned in a manner effective to direct a pattern in a block copolymer film.

Further disclosed herein is a process for directing a multiplied pattern in a block copolymer film, said process comprising: selecting a block copolymer having two or more spontaneously separating blocks; providing a base having a neutral coating on the base, and a pattern in the neutral coating, said pattern comprising an array of two or more trenches, said trenches having walls; providing a pinning material in the trenches to form a prepared substrate, said pinning material having a greater affinity for one of the two or more spontaneously separating blocks than for any other of the two or more spontaneously separating blocks; coating the block copolymer on the prepared substrate; wherein each block in the block copolymer has a characteristic length, wherein the block copolymer has a characteristic pitch, wherein the pinning material is coated on the walls of the trenches, and wherein the trenches are dimensioned in a manner effective to direct a pattern in a block copolymer film.

Still further disclosed herein is a process for directing a multiplied pattern in a block copolymer film, said process comprising: selecting a block copolymer having two or more spontaneously separating blocks; providing a base having a neutral coating thereon; forming a pattern in the neutral coating by a lithographic process; wherein the lithographic process comprises (i) coating, exposing, and developing a photoresist to produce a photoresist pattern; (ii) etching the neutral layer using the photoresist pattern as a mask; and (iii) stripping the photoresist with solvent(s) or solvent(s) vapor; said pattern in the neutral coating comprising an array of two or more trenches, said trenches having walls; providing a pinning material in the trenches to form a prepared substrate, said pinning material having a greater affinity for one of the two or more spontaneously separating blocks than for any other of the two or more spontaneously separating blocks; coating the block copolymer on the prepared substrate; wherein each block in the block copolymer has a characteristic length, wherein the block copolymer has a characteristic pitch, wherein the pinning material is coated on the walls of the trenches, and wherein the trenches are dimensioned in a manner effective to direct a pattern in a block copolymer film.

In a further embodiment, at least one of the two or more trenches may be divided segmentally along the length of the trench, wherein the length of the trench may be linear or nonlinear.

The trenches may be dimensioned in various ways so as to be effective in directing a pattern in the block copolymer film. For example, the trenches may be pitched at a distance that is approximately an integral number of characteristic pitch distances in the selected block copolymer. Selection of the pitch of the trenches may depend on the desired level of tolerable error. For example, a trench pitch distance having a smaller number of characteristic pitch distances based on the block copolymer may lead to fewer self assembly errors than a trench pitch distance having a larger number of characteristic pitch distances based on the block copolymer. In addition, the widths of the trenches play a role in pattern replication. For example, the width of a trench may vary from one characteristic width of one of the blocks in the block copolymer to the summed width of several adjacent characteristic widths. It is understood that the characteristic widths of the blocks may differ and would therefore need to be summed accordingly. While it is not always necessary for trench widths to be equivalent to the sum of one or more characteristic widths in the block copolymer, it is usually desirable for high affinity interactions to occur at the surfaces of the trenches as depicted, for example in FIG. 1(g) or FIG. 2(h).

Neutral layers are characterized in that they do not have a preferential affinity for either of the blocks in a block copolymer. Accordingly, a neutral layer may, without limitation, comprise the same monomer repeat units as the block copolymer but randomized or synthesized in such a way that the monomers are approximately uniformly distributed across the polymer chains. For example, instead of random chains it may be desirable to use alternating polymers in which monomer A alternates with monomer B in the polymer chain. Neutral layers may be functionalized polymer brushes, cross-linkable polymers, random copolymers having similar repeat units to those used in the block copolymer being used or blends of homopolymers, each respectively having similar monomers to those in the block copolymer being used.

Producing polymer neutral layers in which the monomers are at least approximately uniformly distributed may be accomplished in several ways. For example, if free radical polymerization is used, it may be desirable to feed the individual monomers to the reaction vessel in such a way as to account for their individual reactivities. Without intending to be bound by theory, it may be desirable to feed a monomer, A, that is relatively more reactive with other A monomers into the reaction vessel more slowly such that the reaction is effectively "starved" of A throughout the reaction. This allows reaction of monomer A with another monomer, B, before more A is introduced. Other polymerization methods may be useful in producing polymers in which the distribution across the polymer chain is approximately uniform. Non limiting examples of such methods include living free radical polymerization, anionic polymerization, cationic polymerization, condensation polymerization, plasma polymerization, metal catalyzed polymerization including metallocene polymerization, metathesis polymerization, and the like.

Neutral layers may also include monomers and additives for crosslinking. Such materials may include, without limitation, aminoplast crosslinkers such as melamines and glycolurils, epoxy and oxetane resins, urethane resins, formaldehyde resins, cage amine materials such as hexamethylene tetramine, polyols, and the like.

Polymers suitable for neutral layers will depend on the particular block copolymer chosen. However, neutral layer materials may comprise monomer repeat units that comprise, without limitation styrene, 4-vinyl-1,2-dihydrocyclobutabenzene, 4-vinyl pyridine, butadiene, isoprene, methyl (meth)acrylate, polyethylene oxide, polyethylene-propylene, polycaprolactone, polycaprolactam, poly-t-butyl (meth) acrylate, propylene oxide, tetrahydropyran, dimethylsiloxane, malaic anhydride, itaconic anhydride, malimide, maleic acid, itaconic acid, caproic acid, lactic acid, glycine, ethylene, propylene, 1-butene, 1,3-butadiene, norbornene, 4-hydroxy styrene, 4-acetoxy styrene, 4-methylstyrene, alpha-methylstyrene, ethyl (meth)acrylate, n-propyl (meth) acrylate, isopropyl (meth)acrylate, n-butyl (meth)acrylate, isobutyl (meth)acrylate, n-pentyl (meth)acrylate, isopentyl (meth)acrylate, neopentyl (meth)acrylate, n-hexyl (meth) acrylate, cyclohexyl (meth)acrylate, isobornyl (meth)acrylate, hydroxyethyl (meth)acrylate or a copolymer comprising at least one of the above.

Further, without limitation, copolymers used as neutral layers may comprise poly(methylmethacrylate-styrene) poly(butadiene-butylmethcrylate), poly(butadiene-dimethylsiloxane), poly(butadiene-methylmethacrylate), poly(butadiene-vinylpyridine), poly(isoprene-methylmethacrylate), (polyisoprene-vinylpyridine), poly(butylacrylate-methylmethacrylate), poly(butylacrylate-vinylpyridine), (polyhexylacrylate-vinylpyridine), poly(isobutylene-butylmethacrylate), poly(isobutylene-dimethoxysiloxane), poly(isobutylene-methylmethacrylate), poly(isobutylene-vinylpyridine), poly(isoprene-ethyleneoxide), poly(butylmethacrylate-butylacrylate), poly(butylmethacrylate-vinylpyridine), poly(ethylene-methylmethacrylate), poly(methylmethacrylate-butylacrylate), poly(methylmethacrylate-butylmethacrylate), poly(styrene-butadiene), poly(styrene-butylacrylate), poly(styrene-butylmethacrylate), poly(styrene-butylstyrene), poly(styrene-dimethoxysiloxane), poly(styrene-isoprene), poly(styrene-methylmethacrylate), poly(styrene-vinylpyridine), poly(ethylene-vinylpyridine), poly(vinylpyridine-methylmethacrylate), poly(ethyleneoxide-isoprene), poly(ethyleneoxide-butadiene), poly(ethyleneoxide-styrene), or poly(ethyleneoxide-methylmethacrylate).

Further and without limitation, neutral layers may have non functionalized chain ends or may be telechelic polymers with functionalized chain ends wherein the functional group (s) at the end of the polymer chain may be, without limitation, chosen from an alcohol group, an ester group, a carbonate group, a carboxylic acid group, a phosphonic acid group, a sulfonic acid group, an amine group, an amide or imide group, an epoxy group, a silyl group, an alkoxysilyl group, an alkylsilyl group, an aminosilane group, an isocyanate group, a thiocyanate group, or an isothiocyanate group.

The pinning material may be a pure polymer or a polymer blend. Moreover, the pinning material may comprise a polymer blended with oligomers, monomers or other small molecules such as leveling agents, dissolution modifiers, flexiblizers, plasticizers and the like. In addition, the polymer may be, a telechelic polymer which, without limitation may be monofunctional or difunctional, wherein the functional group(s) at the end of the polymer chain may be, without limitation, chosen from an alcohol group, an ester group, a carbonate group, a carboxylic acid group, a phosphonic acid group, a sulfonic acid group, an amine group, an amide or imide group, an epoxy group, a silyl group, an alkoxysilyl group, an alkylsilyl group, an aminosilane group, an isocyanate group, a thiocyanate group, or an isothiocyanate group. Herein, a polymer pinning material is understood to include homopolymers and copolymers, monodisperse polymers, polydisperse polymers, oligomers star polymers and the like. The monomer repeat units in the pinning material may be the same or similar to those in one of the blocks in the selected block copolymer. For example, if the selected block copolymer is (b)-polystyrene-(b)-polymethylmethacrylate, the pinning material could comprise polystyrene or polymethyl methacrylate or polymers having similar repeat units such as poly-4-methylstyrene or polymethyl acrylate, which may have functional end groups as described above. The molecular weight of the polymer in the pinning may be, for example 800-500,000 Daltons. As a further example, the molecular weight of the polymer in the pinning material may be between 2,000-200,000 Daltons. As a still further example, the molecular weight of the polymer in the pinning material may be between 10,000-100,000 Daltons.

The pinning material may be introduced into the trenches by applying a solution comprising the pinning material in a suitable solvent to the substrate (having the base and the imaged neutral layer) by any acceptable coating method such as spin coating, spray coating, dip coating, roller coating or the like. Although not being bound by theory, the pinning material may interact with the surfaces of the trench such that after removal of the pinning material a coating remains on the surface the trench. The coated substrate may then be baked to remove the residual solvent. Alternatively, a curable formulation may be applied and cured by thermal or photo curing depending on the chemistry. Once the pinning material is coated on the substrate, the material not in the trenches may be removed by washing the coated substrate with a suitable solvent until the pinning material is washed from the neutral layer but remains coated over the trench surfaces. Alternatively, the coated substrate may be subjected to chemical mechanical polishing in a damascene-type process. As a further alternative, the coated substrate may be subjected to a plasma or reactive-ion etch process that removes the pinning material down to the neutral layer, leaving the pinning material in the trenches.

Suitable solvents for the pinning layer formulation include glycol ether acetates, esters, α-hydroxy esters, α-alkoxy esters alcohols, ketones, amides, imides, ethers, ether esters, ether alcohols and the like. Specifically, solvents may include, without limitation, ethylene glycol monoethyl ether acetate, propylene glycol monomethyl ether acetate (PGMEA), ethyl-3-ethoxypropionate, methyl-3-methoxypropionate, n-butyl acetate, amyl acetate, cyclohexyl acetate, 3-methoxybutyl acetate, 3-ethoxyethyl propionate, 3-ethoxymethyl propionate, 3-methoxymethyl propionate, methyl acetoacetate, ethyl acetoacetate, methyl pyruvate, ethyl pyruvate, propylene glycol monomethyl ether propionate, propylene glycol monoethyl ether propionate, methyl ethyl ketone, methyl amyl ketone, cyclohexanone, cyclopentanone, diacetone alcohol, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethylsulfoxide, γ-butyrolactone, γ-valerolactone, δ-valerolactone, propylene glycol methyl ether acetate, propylene glycol ethyl ether acetate, propylene glycol propyl ether acetate, methyl lactate, ethyl lactate, propyl lactate, and tetramethylene sulfone. The solvents may be used alone or as mixtures. In addition, similar solvents and solvent blends may be used to rinse the pinning layer from the neutral layer and leaving behind the trench whose surface is coated with the pinning material.

Within a trench, the physical morphology of the pinning material may be highly conformal to the walls of the trench or may exhibit a tendency to impart some planarity to the trench. Such characteristics may depend on the molecular weight of the pinning material. For example, without intending to be bound by theory, pinning materials having weight average molecular weights greater than about 20,000 Daltons, may provide more conformal coatings to the original coated neutral layer; thus leaving more conformal coatings after the solvent rinse. On the other hand, pinning materials having molecular weights less than about 20,000 Daltons may show more planarizing behavior in the original coating, presenting the opportunity of producing a relatively more planar coated trench after rinsing.

As noted supra, the pinning material may comprise a nonfunctionalized or telechelic polymer. Such a polymer may comprise one or more repeat units chosen from a substituted or unsubstituted styrene, a (meth)acrylate, a substituted or unsubstituted vinyl pyridine, a diene, one or more olefins, an unsaturated anhydride, an unsaturated diacid, an unsaturated acid-ester, one or more olefin oxides, a siloxane, a homopolyester, a heteropolyester couple, a homopolyamide, a heteropolyamide couple or combinations thereof. Wherein a homopolyester comprises monomer repeat units deriving from both alcohol and acid functional groups on the same repeat unit, and a heteropolyester comprises coupled monomer repeat units, one member of the couple deriving from two or more acid groups and one member of the couple deriving from two or more alcohol groups. Wherein a homopolyamide comprises monomer repeat units deriving from both amine and acid functional groups on the same repeat unit, and a rheteropolyamide comprises coupled monomer repeat units, one member of the couple deriving from two or more acid groups and one member of the couple deriving from two or more amine groups. Wherein acid groups may be carboxylic phosphonic or sulfonic acids.

The pinning material may comprise a nonfunctionalized or telechelic polymer, having repeat units chosen from, without limitation, styrene, 4-vinyl pyridine, butadiene, isoprene, methyl (meth)acrylate, polyethylene oxide, polyethylene-propylene, polycaprolactone, polycaprolactam, poly-t-butyl (meth)acrylate, propylene oxide, tetrahydropyran, dimethylsiloxane, maleic anhydride, itaconic anhydride, maleimide, maleic acid, itaconic acid, caproic acid, lactic acid, glycine, ethylene, propylene, 1-butene, 1,3-butadiene, norbornene, 4-hydroxy styrene, 4-acetoxy styrene, 4-methylstyrene, alpha-methylstyrene, ethyl (meth)acrylate, n-propyl (meth)acrylate, isopropyl (meth)acrylate, n-butyl (meth)acrylate, isobutyl (meth)acrylate, n-pentyl (meth)acrylate, isopentyl (meth)acrylate, neopentyl (meth)acrylate, n-hexyl (meth)acrylate, cyclohexyl (meth)acrylate, isobornyl (meth)acrylate, hydroxyethyl (meth)acrylate or a copolymer comprising at least one of the above.

The trenches in the neutral layer can be introduced using normal lithographic techniques, such as near-UV, 248 nm immersion and dry, 193 nm immersion and dry, 157 nm, EUV, x-ray, e-beam, ion beam and the like. Either positive or negative photoresists may be used. Once the lithographic pattern is printed, the underlying neutral layer may be etched by wet etching, reactive ion etching, or plasma etching. The neutral layer may also be etched directly by such techniques as electron or ion milling. In addition, the trenches may be introduced into the neutral layer by imprint lithography.

In situations where photoresist is used, removal of the photoresist after etching the neutral layer and without damaging the neutral layer, may be effected successfully using solvents and solvent vapors comprising lactones or any commercial photoresist strippers such as AZ® 400T. Without limitation, such lactones may include γ-butyrolactone, γ-valerolactone, δ-valerolactone, 3-methyl-γ-butyrolactone, 2-methyl-γ-butyrolactone, 2-methyl-γ-valerolactone, 3-methyl-γ-valerolactone, 4-methyl-γ-valerolactone, 2-methyl-γ-valerolactone, 3-methyl-δ-valerolactone or mixtures thereof. These lactone solvents may be used alone, in solutions with cosolvents and diluents or in sequential steps with solvents and diluents. Suitable cosolvents, solvents and diluents may include glycol ether acetates, esters, α-hydroxy esters, α-alkoxy ester alcohols, ketones, amides, imides, ethers, ether esters, ether alcohols and the like. Specifically, solvents may include, without limitation, ethylene glycol monoethyl ether acetate, propylene glycol monomethyl ether acetate (PGMEA), ethyl-3-ethoxypropionate, methyl-3-methoxypropionate, toluene, mixed xylenes, o-xylene, m-xylene, p-xylene, anisole, n-butyl acetate, amyl acetate, cyclohexyl acetate, 3-methoxybutyl acetate, 3-ethoxyethyl propionate, 3-ethoxymethyl propionate, 3-methoxymethyl propionate, methyl acetoacetate, ethyl acetoacetate, methyl pyruvate, ethyl pyruvate, propylene glycol monomethyl ether propionate, propylene glycol monoethyl ether propionate, methyl ethyl ketone, methyl amyl ketone, cyclohexanone, cyclopentanone, diacetone alcohol, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethylsulfoxide, propylene glycol methyl ether acetate, propylene glycol ethyl ether acetate, propylene glycol propyl ether acetate, methyl lactate, ethyl lactate, propyl lactate, butyl lactate, and tetramethylene sulfone. The solvents may be used alone or as mixtures.

The base may comprise any flat material, such as a semiconductor substrate including gallium arsenide, indium phosphide, or silicon. Moreover, the semiconductor substrate may be coated with any material or collection of materials encountered in known semiconductor, electronic or optical processing, such as antireflective coatings. Examples include, without limitation, silicon dioxide, silicon monoxide, silicon nitride, silicon oxynitride, silicon carbide, aluminum, copper, titanium, titanium nitride, tantalum nitride, aluminum, copper, titanium, chromium, zirconium oxide or europium oxide, polysilicon, ceramics, perovskites, or ferroelectric polymers. In addition, these substrates may be coated with antireflective coating(s).

The blocks of organic block copolymer may comprise repeat units derived from monomers such as $C_{2-30}$ olefins, (meth)acrylate monomers derived from $C_{1-30}$ alcohols, inorganic-containing monomers including those based on Si, Ge, Ti, Fe, Al. Block copolymers can comprises one block of monomeric units which are etch resistant and another block of monomeric units that are highly etchable. Monomers based on $C_{2-30}$ olefins can make up a block of high etch resistance alone or do so in combination with one other olefinic monomer. Specific example of olefinic monomers of this type are ethylene, propylene, 1-butene, 1,3-butadiene, isoprene, dihydropyran, norbornene, maleic anhydride, styrene, 4-hydroxy styrene, 4-acetoxy styrene, 4-methylstyrene, alpha-methylstyrene or mixtures thereof. Examples of highly etchable units can be derived from (meth)acrylate monomers such as (meth)acrylate, methyl (meth)acrylate, ethyl (meth)acrylate, n-propyl (meth)acrylate, isopropyl (meth)acrylate, n-butyl (meth)acrylate, isobutyl (meth)acrylate, n-pentyl (meth)acrylate, isopentyl (meth)acrylate, neopentyl (meth)acrylate, n-hexyl (meth)acrylate, cyclohexyl (meth)acrylate, isobornyl (meth)acrylate, hydroxyethyl (meth)acrylate or mixtures thereof. The characteristic domain pitch of the block copolymer, Lo, may range from 2 nm to 200 nm, or 5 nm to 100 nm, or from 10 nm to 50 nm.

An illustrative example of a block copolymer containing one type of high etch resistant repeat unit would be a polystyrene block containing only repeat units derived from styrene and another type of highly etchable polymethylmethacrylate block containing only repeat units derived from methylmethacrylate. These together would form the block copolymer poly(styrene-b-methylmethacrylate), where b refers to block.

More specifically, non-limiting examples of block copolymers that are useful for graphoepitaxy, chemoepitaxy or pinned chemoepitaxy as used for directed self assembly on a patterned neutral layer, are poly(styrene-b-vinyl pyridine), poly(styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly(styrene-b-isoprene-b-ethylene oxide), poly(styrene-b-dimethylsiloxane), poly(methyl methacrylate-b-dimethylsiloxane), or a combination comprising at least one of the above described block copolymers. All these polymeric materials share in common the presence of at least one block which is rich in repeat units resistant to etching techniques typically employed in manufacturing IC devices and at least one block which etches rapidly under these same conditions. This allows for the directed self assembled polymer to pattern transfer onto the substrate to affect either pattern rectification or pattern multiplication.

Block copolymers of the present disclosure have a weight-averaged molecular weight (Mw) in the range of about 3,000 to about 500,000 gmol and a number averaged molecular weight (Mn) of about 1,000 to about 60,000 and a polydispersity $(M_w/M_n)$ of about 1.01 to about 6, or 1.01 to about 2 or 1.01 to about 1.3. Molecular weight, both $M_w$ and $M_n$, can be determined by, for example, gel permeation chromatography calibrated against polystyrene standards.

This ensures that the polymer blocks have enough mobility to undergo self assembly when applied to a given surface either spontaneously, or by using a purely thermal treatment, or through a thermal process which is assisted by the absorption of solvent vapor into the polymer framework to increase flow of segments enabling self assembly to occur.

Suitable solvents for block copolymer formulations can vary with the solubility requirements of the block copolymer. Non limiting examples of such solvents include glycol ether acetates, esters, α-hydroxy esters, α-alkoxy ester alcohols, ketones, amides, imides, ethers, ether esters, ether alcohols and the like. Specifically, solvents may include, without limitation, ethylene glycol monoethyl ether acetate, propylene glycol monomethyl ether acetate (PGMEA), ethyl-3-ethoxypropionate, methyl-3-methoxypropionate, toluene, mixed xylenes, o-xylene, m-xylene, p-xylene, anisole, n-butyl acetate, amyl acetate, cyclohexyl acetate, 3-methoxybutyl acetate, 3-ethoxyethyl propionate, 3-ethoxymethyl propionate, 3-methoxymethyl propionate, methyl acetoacetate, ethyl acetoacetate, methyl pyruvate, ethyl pyruvate, propylene glycol monomethyl ether propionate, propylene glycol monoethyl ether propionate, methyl ethyl ketone, methyl amyl ketone, cyclohexanone, cyclopentanone, diacetone alcohol, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethylsulfoxide, γ-butyrolactone, γ-valerolactone, δ-valerolactone, propylene glycol methyl ether acetate, propylene glycol ethyl ether acetate, propylene glycol propyl ether acetate, methyl lactate, ethyl lactate, propyl lactate, butyl lactate, and tetramethylene sulfone. The solvents may be used alone or as mixtures.

The block copolymer composition can comprise additional components and/or additives selected from the group consisting of: inorganic-containing polymers; additives including small molecules, inorganic-containing molecules, surfactants, photoacid generators, thermal acid generators, quenchers, hardeners, cross-linkers, chain extenders, and the like; and combinations comprising at least one of the foregoing, wherein one or more of the additional components and/or additives co-assemble with the block copolymer to form the block copolymer assembly.

The block copolymer composition is applied to the substrate described supra which has been defined on a surface by conventional lithography. The neutral surface may be a crosslinked coating or otherwise incapable of being dissolved by the solvents used to cast coatings on top of it. Upon application and solvent removal, the block copolymer then undergoes self assembly directed by the specific pattern formed by conventional lithographic processing over the neutral layer through either actual topographical features or a patterned chemical difference of the substrate surface created by conventional lithographic process.

The application of the block copolymer by spinning techniques (including spin drying) can suffice to form the self directed block copolymer assembly. Other methods of self directed domain formation can occur during applying, baking, annealing, or during a combination of one or more of these operations. In this way, an oriented block copolymer assembly is prepared by the above method, having phase-separated domains that comprise cylindrical domains oriented perpendicular to the neutral surface, or that comprise lamellar domains oriented perpendicular to the neutral surface. Frequently, the phase-separated domains are lamellar domains oriented perpendicular to the neutral surface, which provide parallel linespace patterns in the block copolymer assembly. The domains, so oriented, are desirably thermally stable under further processing conditions. Thus, after coating a layer of a block copolymer assembly including a useful diblock copolymer such as, for example, poly(styrene-b-methyl methacrylate), and optionally baking and/or annealing, the domains of the block copolymer will form on and remain perpendicular to the neutral surface, giving highly resistant and highly etchable regions on the surface of the substrate, which can be further pattern transferred in the substrate layers. The directed self assembled block copolymer pattern is transferred into the underlying substrate using known techniques. In one example wet or plasma etching could be used with optional UV exposure. Wet etching could be with acetic acid. Standard plasma etch process, such as a plasma comprising oxygen may be used; additionally argon, carbon monoxide, carbon dioxide, $CF_4$, $CHF_3$, may be present in the plasma. The block copolymer is then coated over a chemically modified neutral layer and annealed to form domains perpendicular to the substrate surface. One of the domains is then removed to form a pattern on the surface of the substrate.

EXAMPLES

Comparative Example 1

A silicon wafer was coated at 1500 rpm with Si-antireflective coating (ARC) obtained from Shinetsu Chemical Co. Ltd. (SHB A940) and baked at 220° C. for 90 s to form a base. A solution of 0.4% w/w hydroxyl-terminated cross-linkable poly [styrene-random-vinylbenzocylcobutene-random-methylmethacrylate] (X-PS-r-PMMA-OH) solution in propylene glycol monomethyl ether acetate (PGMEA) solvent was coated at 1500 rpm and baked at 250° C. for 120 s on the base. Fujifilm Electronic Materials (FAiRS M190 NTD) photoresist was coated at 1500 rpm and baked at 100° C. for 60 s. After exposure on a 193 nm immersion lithography tool (ASML NXT-1950i scanner, NA: 1.35, dipole illumination (35×, 0.76/0.66), post exposure bake was performed at 100° C. for 60 s. The trench pattern was created in the neutral layer by plasma etching with oxygen and argon gas system (pressure: 50 mtorr, 15 sccm (O2), 100 sccm (Ar), power: 50 W). The photoresist was stripped using a stream of gamma valerolactone (GVL), followed by a stream of PGMEA at room temperature and spin dried. A 1.4% ww solution of poly(styrene-block-methyl methacrylate) (PS-b-PMMA) polymer (Lo of 30 nm) in PGMEA solvent was coated at 1500 rpm and annealed at 250° C. for 5 minutes in air to produce the pattern of FIG. 3(a). An examination of the fingerprint pattern in the figure indicated little guided self assembly took place in the block copolymer and was not acceptable.

Example 2

The experiment was repeated as in the Comparative Example except that prior to the application of the block copolymer, (PS-b-PMMA), a solution of pinning layer material, 2% ww hydroxyl-terminated polystyrene (PS) in n-butyl acetate (n-BA) was coated at 1500 rpm and baked at 130° C. for 2 min. A PGMEA solvent was used to rinse the coated pinning material from the surface of the neutral layer leaving a portion of the pinning material coating the trench. The wafer was then baked on a hotplate at 130° C. for 2 min. Subsequently, the block copolymer solution and the wafer sample was processed as supra. An inspection of fingerprint pattern as shown in FIG. 3(b) indicated successful self assembled direction of block copolymer features.

Although the present invention has been shown and described with reference to particular examples, various changes and modifications which are obvious to persons skilled in the art to which the invention pertains are deemed to lie within the spirit, scope and contemplation of the subject matter set forth in the appended claims.

What is claimed is:

1. A template for directing a pattern in a block copolymer film, said block copolymer having two or more spontaneously separating blocks, wherein the block copolymer has a characteristic pitch, said template consisting essentially of:
   a. a substrate consisting essentially of a base and a neutral coating on the base, said neutral coating having an array comprising two or more trenches etched therein; said trenches having wads and floors, and
   wherein said neutral coating, prior to trench etching is formed from functionalized polymer brushes, cross-linkable polymers, or random copolymers, or blends of homopolymers; and
   b. a pinning material in the trenches, said pinning material having a greater affinity for one of the two or more spontaneously separating blocks than for any other of the two or more spontaneously separating blocks, and wherein the pinning material is coated on the walls and floors of the trenches and conforms to the walls of the trenches and the trenches are maintained, and wherein the widths of the trenches are dimensioned in a manner effective to direct a pattern by pinned chemoepitaxy in a block copolymer film that overlays both the neutral layer and the trenches, wherein the pinning material comprises a polymer comprising a repeat unit selected from a group consisting of substituted styrene, unsubstituted styrene, (meth)acrylate, substituted vinyl pyridine, unsubstituted vinyl pyridine, a diene, one or more olefins, an unsaturated anhydride, an unsaturated diacid, an unsaturated acid-ester, one or more olefin oxides, a dioxane, a homopolyester, a heteropolyester couple, a homopolyamide couple, a heteropolyamide couple or combinations thereof and further wherein the pinning material comprises a monofunctional or difunctional telechelic polymer, comprising a reactive end group selected from a group consisting of an alcohol group, an ester group, a carbonate group, a carboxylic acid group, a phosphonic acid group, a sulfonic acid group, an amine group, an amide or imide group, an epoxy group, a silyl group, an alkoxysilyl group, an alkylsilyl group, an aminosilane group, a nitrile group, an isocyanate group, a thiocyanate group, and an isothiocyanate group.

2. The template of claim 1, wherein the pinning material comprises a polymer, said polymer comprising a repeat unit common to one of the blocks in the block copolymer to be coated on the template.

3. The template of claim 1, wherein the trenches are pitched at one or more selected pitch distances and where the one or more selected pitch distances separating the two or more trenches are chosen to be an approximately integral number of characteristic pitch distances in the block copolymer.

4. The template of claim 1, wherein the width of at least one of the trenches is a factor of about 0.1 to about 2.0 times the characteristic pitch of the selected pitch of the block copolymer.

5. The template of claim 1, wherein the pinning material has a molecular weight of ≤20,000 Da.

6. The template of claim 1, wherein said template is consisting of:

a. a substrate consisting of a base and a neutral coating on the base, said neutral coating having an array comprising two or more trenches etched therein; said trenches having walls and floors, and wherein said neutral coating, prior to trench etching is formed from functionalized polymer brushes, cross-linkable polymers, or random copolymers, or blends of homopolymers; and b. a pinning material in the trenches, said pinning material having a greater affinity for one of the two or more spontaneously separating blocks than for any other of the two or more spontaneously separating blocks, and wherein the pinning material is coated on the walls and floors of the trenches and conforms to the walls of the trenches and the trenches are maintained, and wherein the widths of the trenches are dimensioned in a manner effective to direct a pattern by pinned chemoepitaxy in a block copolymer film that overlays both the neutral layer and the trenches, wherein the pinning material comprises a polymer comprising a repeat unit selected from a group consisting of substituted styrene, unsubstituted styrene, (meth)acrylate, substituted vinyl pyridine, unsubstituted vinyl pyridine, a diene, one or more olefins, an unsaturated anhydride, an unsaturated diacid, an unsaturated acid-ester, one or more olefin oxides, a siloxane, a homopolyester, a heteropolyester couple, a homopolyamide couple, a heteropolyamide couple or combinations thereof and further wherein the pinning material comprises a monofunctional or difunctional telechelic polymer, comprising a reactive end group selected from a group consisting of an alcohol group, an ester group, a carbonate group, a carboxylic acid group, a phosphonic acid group, a sulfonic acid group, an amine group, an amide or imide group, an epoxy group, a silyl group, an alkoxysilyl group, an alkylsilyl group, an aminosilane group, a nitrile group, an isocyanate group, a thiocyanate group, and an isothiocyanate group.

7. The template of claim 1, wherein the pinning material comprises a polymer comprising a repeat unit selected from a group consisting of substituted styrene, unsubstituted styrene, (meth)acrylate, substituted vinyl pyridine, unsubstituted vinyl pyridine, a diene, one or more olefins, an unsaturated anhydride, an unsaturated diacid, an unsaturated acid-ester, one or more olefin oxides, a siloxane, a homopolyester, a heteropolyester couple, a homopolyamide couple, or a heteropolyamide couple and further wherein the pinning material comprises a monofunctional or difunctional telechelic polymer, comprising a reactive end group selected from a group consisting of an alcohol group, an ester group, a carbonate group, a carboxylic acid group, a phosphonic acid group, a sulfonic acid group, an amine group, an amide or imide group, an epoxy group, a silyl group, an alkoxysilyl group, an alkylsilyl group, an aminosilane group, a nitrile group, an isocyanate group, a thiocyanate group, and an isothiocyanate group.

8. The template of claim 1, wherein further said pinning layer material is a polymer whose repeat units are either a substituted styrene, an unsubstituted styrene, a (meth)acrylate, a substituted vinyl pyridine, or an unsubstituted vinyl pyridine and further wherein said pinning material is a monofunctional or difunctional telechelic polymer, comprising a reactive end group selected from a group consisting of an alcohol group, an ester group, a carbonate group, a carboxylic acid group, a phosphonic acid group, a sulfonic acid group, an amine group, an amide or imide group, an epoxy group, a silyl group, an alkoxysilyl group, an alkylsilyl group, an aminosilane group, a nitrile group, an isocyanate group, a thiocyanate group, and an isothiocyanate group.

9. The template of claim 1, wherein further said pinning layer material is a polymer whose repeat units are either a substituted styrene, an unsubstituted styrene, a (meth)acrylate, a substituted vinyl pyridine, or an unsubstituted vinyl pyridine and further wherein said pinning material is a monofunctional or difunctional telechelic polymer, comprising a reactive end group selected from a group consisting of an alcohol group, an ester group, a carbonate group, a carboxylic acid group, a phosphonic acid group, an epoxy group, a silyl group, an alkoxysilyl group, an alkylsilyl group, an aminosilane group, an isocyanate group, a thiocyanate group, and an isothiocyanate group.

* * * * *